United States Patent
Bolam et al.

[11] Patent Number: 5,804,459
[45] Date of Patent: Sep. 8, 1998

[54] METHOD FOR CHARGE ENHANCED DEFECT BREAKDOWN TO IMPROVE YIELD AND RELIABILITY

[75] Inventors: Ronald Jay Bolam, East Fairfield; Albert John Gregoritsch, Jr., South Burlington, both of Vt.

[73] Assignee: International Business Machines Corporation, Armonk, N.Y.

[21] Appl. No.: 751,151

[22] Filed: Nov. 15, 1996

[51] Int. Cl.$^6$ .................................................. H01L 21/66
[52] U.S. Cl. .............................................. 438/12; 438/17
[58] Field of Search .................................. 438/5, 10, 11, 438/12, 17, 18

[56] References Cited

U.S. PATENT DOCUMENTS

| | | | |
|---|---|---|---|
| 5,103,557 | 4/1992 | Leedy | 438/12 |
| 5,279,687 | 1/1994 | Tuppen et al. | 148/33.2 |
| 5,410,122 | 4/1995 | Su et al. | 219/121.44 |
| 5,502,010 | 3/1996 | Nadahara et al. | 437/247 |
| 5,516,369 | 5/1996 | Lur et al. | 134/1.3 |
| 5,519,193 | 5/1996 | Freiermuth et al. | 438/17 |

*Primary Examiner*—Chandra Chaudhari
*Attorney, Agent, or Firm*—Schmeiser, Olsen & Watts; Mark F. Chadurjian

[57] ABSTRACT

According to the present invention, an improved method for locating particle contamination during the integrated circuit manufacturing process is disclosed. The integrated circuit wafer is grounded and then exposed to an electron beam to create an enhanced electrical potential in any conducting or semi-conducting particles embedded in the layered wafer. The embedded particle will begin to accumulate an electrical charge and will reach a certain electrical potential based on the size and composition of the particle as well as the length of exposure to the electron beam. After a sufficient charge has been accumulated in the embedded particle, the wafer is subjected to burn-in testing. Since the particles embedded in the wafer have been previously exposed to the electron beam, the standard voltages applied during burn-in testing will force a certain number of embedded particles to suffer accelerated breakdown. After the defects have occurred and have been located, on-chip fuses can be used to re-route the circuits. As a final step, the wafer is annealed to remove any residual charge in any remaining particle defects not found by the present invention.

15 Claims, 2 Drawing Sheets

METHOD FOR CHARGE ENHANCED DEFECT BREAKDOWN TO IMPROVE YIELD AND RELIABILITY

BACKGROUND OF THE INVENTION

1. Technical Field

This invention generally relates to the field of semiconductor processing and integrated circuit manufacturing. More specifically, the present invention relates to increasing the reliability of integrated circuit devices.

2. Background Art

Today, our society is heavily dependent on high-tech electronic devices for everyday activity. Integrated circuits are the components that give life to our electronic devices. Integrated circuits are found in widespread use throughout our country, in appliances, in televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers.

Integrated circuits are chemically and physically integrated into a substrate material, such as a silicon or gallium arsenide wafer, by combining electrically conductive, semi-conductive, and dielectric (insulating) layers or regions. The layers and regions are arranged to form electronic components or devices such as transistors, diodes, and capacitors. Thousands of these devices are formed essentially simultaneously on the surface of a single wafer of semiconductor material during processing.

For example, in a typical fabrication process, a layer of aluminum or some other metal is deposited on the surface of the wafer substrate. The metal layer is patterned to form interconnect paths along the surface of the wafer substrate. The substrate typically contains certain dopant materials which form transistor components. Examples of possible substrate components include N-well or P-well sources, drains, and junctions. In most processes, an insulating or dielectric layer is then deposited over the first metal layer. Vias, or holes, are then created in the dielectric layer and a second metal layer is deposited over the dielectric layer. The second metal layer covers the intervening dielectric layer and fills the via openings in the dielectric layer down to the first metal layer. These filled via openings provide electrical connections between the first and second metal layers. The second metal layer is also patterned to form additional circuit devices and paths. The dielectric layer acts as an insulator between the first and second metal layer. This process can be repeated with additional layers as necessary to create the desired functionality in the circuits located on the wafer.

The integrated circuit manufacturing process described above is typically conducted in areas known as "clean rooms." A clean room is a fabrication or manufacturing area where the environment is tightly controlled in order to reduce the presence of possible contaminants. There are many sources of contamination in a typical fabrication environment. Air-borne particles, dust, metal from the fabrication process, contaminants in the processing fluids used during the fabrication process, etc. may all be possible contamination sources. In addition, contaminants may come from a typical sputtering or re-sputtering process, residue from a lift-off or photolithography process, etc.

Particle contamination typically results when small conducting or semi-conducting particles or contaminants settle on the surface of a wafer and become encapsulated or embedded in an integrated circuit as subsequent layers are deposited over the surface of the wafer during the integrated circuit fabrication process. These embedded particles may be small pieces of metal, carbon, etc. Depending on the size of the particle and the location on the wafer where it settles, circuit failure may often occur. For example, an electrically conducting particle may come to rest between two metal interconnect lines that are part of an integrated circuit. If the particle is large enough, it may bridge the gap between the two metal lines and create a direct short, causing circuit failure. Even if the particle isn't large enough to completely bridge the gap, electrical current flowing through the integrated circuit may still cause circuit failure. Typically, an electrical arc will bridge the distance between the particle and a metal line or structure, the intervening oxide or insulating material will "breakdown," and the residue that remains in the insulating material will continue to support electrical flow through the insulative material. This breakdown defect will typically cause the current to flow along paths other than the designed circuit paths and circuit operation will be impaired. Depending on the exact size, composition, and location of the particle, the particle breakdown may occur rapidly or, in some cases, only after a significant amount of time has passed and the product has been placed in operational use.

The problems associated with particle-related contamination are a significant factor in both increased circuit failure and increasing costs in the production of integrated circuits. Due to the extremely small size of today's integrated circuits, even sub-micron sized particles can contaminate the surface of a wafer and cause significant integrated circuit reliability problems. Because of this problem, integrated circuit manufacturers are constantly seeking ways to reduce particle contamination-related problems. Wafers are commonly tested after fabrication to locate any defects, including those attributable to particle contamination. If a specific portion of an integrated circuit contains a particle defect, the particle defect can often be located by conducting a period of "burn-in" testing.

Typically, in order to find particle contaminants that may result in potential defects, various types of "burn-in" testing can be performed. Burn-in testing can be performed directly in-situ on the wafer or later, when the individual integrated circuits have been packaged and incorporated into a finished component or product. For example, once a wafer has been processed, the wafer is tested for defects. A probe device is connected to the pads for each die located on the periphery of the individual integrated circuits. This allows each integrated circuit to be connected to an electrical source and a reference ground to supply an operational current. The wafer is typically tested at voltage levels approximately 1.5 times the rated nominal value. For example, a typical circuit on a wafer may be designed to operate with a supplied voltage level of approximately 3.3 volts. During burn-in testing, the circuit will therefore be operated at a voltage level of approximately 5–6 volts. This enhanced voltage level will cause a flow of electricity and enhanced electric fields throughout the circuit which is greater than normal. The applied levels of current and the resulting electrical fields are controlled so they will not adversely affect the integrated circuit.

During the burn-in testing period, the circuitry on the wafer is electrically exercised. However, a conductive or semi-conductive particle which is located somewhere between the metal lines of the integrated circuit may be isolated by the insulating material from the circuitry. Electrical fields created by the operational current of the integrated circuit and device level phenomenon such as "tunneling" can create electrical charges that accumulate on the particle. The difference in electrical potential caused by charges that can accumulate on the particles in conjunction with normal electrical fields can eventually breakdown the insulative material between the particle and the metal lines or structures as described above. Once the particle defect has caused a breakdown in the insulator, the integrated circuit will cease to operate correctly. Electrical current will "leak" from the circuit through the insulative material.

Once breakdown has occurred and the particle defect has been located, the integrated circuit can be "repaired" by using the common design practice of included redundant circuit paths. Given that integrated circuit failure will often result from defects that occur during wafer fabrication, integrated circuit designers may provide redundant circuit paths in an integrated circuit to allow for failures due to particle defects and other processing problems. On-chip fuses can be activated to create alternative circuit paths, thereby re-routing the flow of electricity around the defective area. These redundant circuit paths allow otherwise unusable integrated circuits to be used, thereby increasing the device yield from a given wafer.

Although the burn-in testing procedures described above can be used to successfully locate some particle defects, care must be exercised so as not to cause destructive damage to the wafer during the burn-in process. Given a nominal voltage level of 3.3 volts, if the burn-in voltage exceeds approximately 6 volts, damage to the integrated circuit transistor junctions and device oxides may occur. In addition, after the integrated circuit has been packaged in a typical plastic package, temperatures in excess of 140° C. will typically cause the packaging material to deform. Given a normal distribution of particle defects on the surface of a wafer some, but not all, of the particle defects can be found by using the standard burn-in techniques described above. However, there are often particles embedded in a wafer that will not have enough charge differential to reach breakdown at the voltage and temperature levels described above. There is obviously a practical balance between stressing the wafer beyond the normal operational limits which can destroy the integrated circuits and trying to cause premature breakdown and thereby locate potential defects due to particle contamination.

The fundamental idea of burn-in testing is to locate and isolate potential defects by accelerating breakdown. Unfortunately, some potential particle contamination-related defects are not identifiable using standard integrated circuit manufacturing testing procedures. Given a standard distribution of embedded particles in a wafer, some of the particles will never accumulate enough charge to reach premature breakdown during the burn-in testing period. Wafers containing these particles may, after many months of operation, finally accumulate enough electrical potential to breakdown and fail. Unfortunately, failure for many particles will usually occur after the product has been placed into service at a customer location.

As the dimensions of the circuits become smaller, solving the problem of potential defects due to particle contamination has become even more critical. As the dimensions between metal interconnections continues to decrease, particles that previously would not have adversely affect integrated circuit operation, can now cause fatal defects. In addition, since many of the defects are undetectable at the time of manufacture, products with defective components due to particle contamination are unknowingly shipped and placed in service. This, in turn, means that replacing failed components in the field becomes increasingly common. Replacement of a component in the field is far more costly than identifying and correcting defects during the manufacturing process. Existing particle defect location methods are increasingly inadequate and significantly hinder further improvements in the reliability rate of integrated circuits.

Therefore, there exists a need to provide an improved method of locating and eliminating particle defects that can cause integrated circuit failure. This improved method should provide a simple and inexpensive technique for locating particles which were previously undetectable using conventional methods which can lead to integrated circuit failure. In addition, the method should be easy to implement with standard integrated circuit processing equipment and should be compatible with existing fabrication processes so that implementation of the method will not be time-consuming or cost prohibitive. Without additional methods for successfully locating and circumventing potential particle defects in integrated circuit manufacturing, enhanced yields and improved reliability rates may be difficult to obtain.

DISCLOSURE OF INVENTION

According to the present invention, an improved method for locating particle contamination during the integrated circuit manufacturing process is disclosed. The integrated circuit wafer is grounded, heated, and then exposed to an electron beam process to create an enhanced electrical potential in any conducting or semi-conducting particles embedded in the layered wafer. As described above, since the circuitry on the wafer is grounded, no electrical potential will accumulate on the metal components of the integrated circuit fabricated on the wafer. However, an embedded conducting or semi-conducting particle which is located somewhere between the metal components of the integrated circuit is typically isolated by the insulating material in the surrounding layer. This embedded particle is not connected to any ground point and is "floating" with respect to ground. The embedded particle will begin to accumulate an electrical charge and will reach a certain electrical potential based on the size and composition of the particle as well as the length of exposure to the electron beam. After a sufficient charge has been accumulated in the embedded particles, the wafer is subjected to burn-in testing as described above. Since the particles embedded in the wafer have been previously exposed to the electron beam, the standard voltages applied during burn-in testing will force a certain number of embedded particles to reach levels of accelerated breakdown. Therefore, a greater number of particle defects will be created in the integrated circuits fabricated on the wafer. After the defects have failed and have been located, on-chip fuses can be used to re-route the circuits, assuming redundant circuit paths are available as described above. As a final step, the wafer is annealed to remove any residual charge in any remaining particle defects not found by the present invention.

The present invention, therefore, used in conjunction with standard testing and product recovery techniques wherever possible, can maximize yield from a given wafer. Further, by locating and accelerating breakdown due to particle defects in the wafer before they are integrated into products and shipped to customers, product reliability can be improved and in-field component replacement costs can be reduced.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

According to the present invention, an improved method for locating and accelerating breakdown due to particle contamination in a layered semiconductor wafer is disclosed. The method of the present invention may be used to maintain or enhance the yield rate of an integrated circuit fabrication process and to increase product reliability over the product's operational lifetime.

A specific preferred embodiment of the present invention for a typical semiconductor device follows. It should be noted that FIGS. 1 and 2 described below represent only a small portion of the surface of a typical 8" semiconductor wafer. The method of the present invention may be successfully implemented with any size of wafer used by those skilled in the art. Additional structures and layers, although not shown, may be present on the surface of the semiconductor wafer as depicted in FIGS. 1 and 2.

Figure 1:
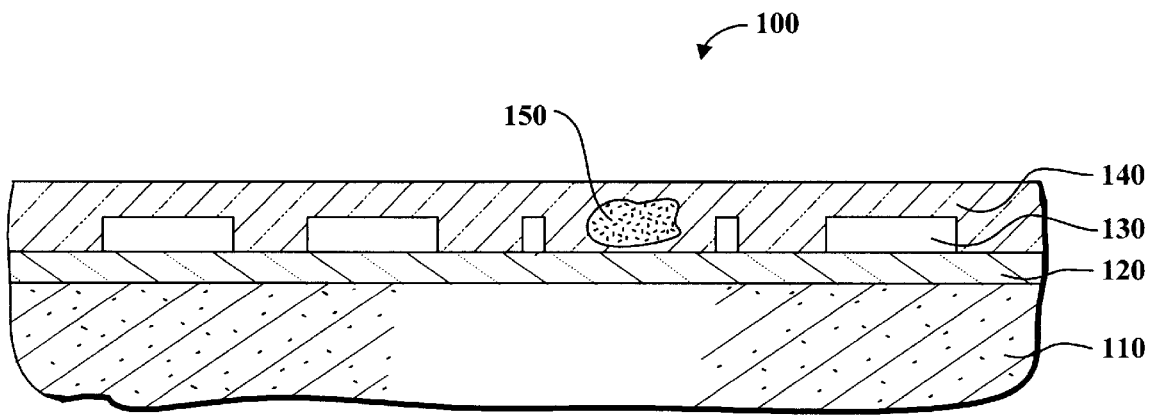
FIG. 1 is a side view of a semiconductor wafer ready for use with a preferred embodiment of the method of the present invention.
Figure 2:
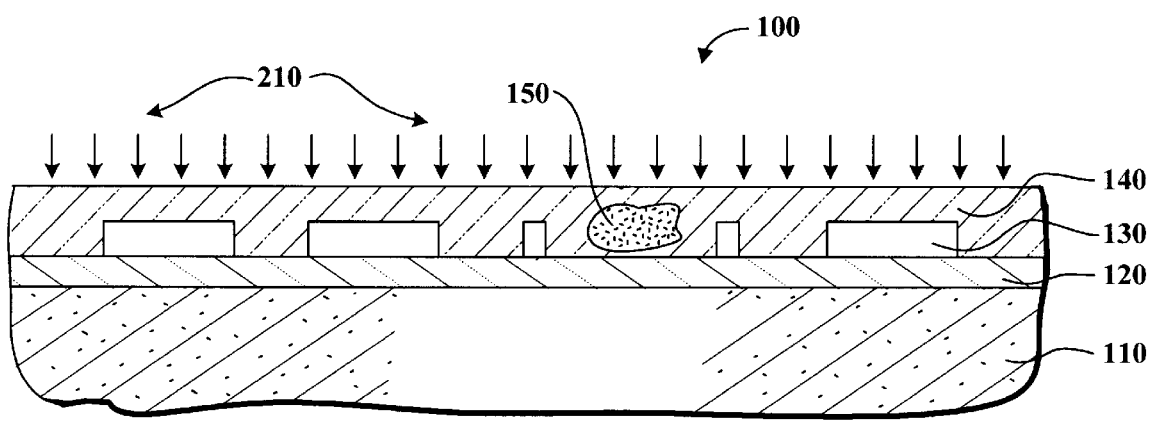
FIG. 2 is a side view of the semiconductor wafer of FIG. 1 being exposed to electron beams.

Referring now to FIG. 1, a wafer structure 100 used for fabricating integrated circuits includes: substrate 10; an insulative layer 120; a patterned metallic layer 130; and a conducting or semi-conducting particle 150. Wafer structure 100 represents a small portion of an integrated circuit chip. Wafer structure 100 may be formed by using any of the integrated circuit fabrication methods or techniques known to those skilled in the art.

Substrate 110 is any substrate used to manufacture integrated circuits such as silicon, gallium arsenide, etc. Substrate 110 will typically contain integrated circuit components such as P-well and N-well diffused regions and other circuit components (not shown) which are well known to those skilled in the art. Insulative layer 120 is typically a layer of silicon dioxide material formed by exposing silicon to oxygen, depositing silicon dioxide, High Density Plasma (HDP) oxide, silicon nitride, aluminum oxide or other similar material on the surface of substrate 110 using chemical vapor deposition (CVD), Plasma Enhanced CVD (PECVD), sputtering or re-sputtering processes. Insulative layer 120 is a dielectric material and acts to passivate or protect substrate 110 as well as to electrically isolate substrate 110 from patterned metallic layer 130.

Patterned metallic layer 130 is formed by any integrated circuit fabrication process or methods now known or hereafter developed. Presently known methods for creating patterned metallic layer 130 include, for example, photolithographic etching with a reactive ion etch process or lift-off techniques. Patterned metallic layer 130 is selectively connected to devices (not shown) at the surface of substrate 110 by connectors (not shown). Patterned metallic layer 130 may be formed from any metal used in integrated circuit fabrication processes now or in the future. This would include, for example, aluminum, aluminum-copper alloys, platinum, palladium, chromium, tungsten, titanium, or molybdenum. Patterned metallic layer 130 is typically used to connect multiple devices and layers in an integrated circuit.

Insulative layer 140 is deposited over previously deposited insulative layer 120 and patterned metallic layer 130. Insulative layer 140 is typically silicon dioxide or a doped silicon oxide layer but may be formed from any material suitable to insulate patterned metallic layer 130 from subsequently deposited layers. Insulative layer 140 may be formed by any process, method, or technique known in the integrated circuit manufacturing art. Typically, insulative layer 140 is formed by plasma enhanced deposition processes.

Particle 150 is a small particle of any conducting or semi-conducting material that may come to be deposited on the surface of wafer structure 100. For the purposes of this specification and the accompanying claims, "conductive" or "semi-conductive" means capable of storing an electrical charge. As shown in FIG. 1, particle 150 is now embedded in insulative layer 140. Particle 150 is not electrically grounded to any portion of the integrated circuit represented by wafer structure 100. The thickness of insulative layer 140 is typically on the order of 2 microns.

Referring now to FIG. 2, to begin testing wafer structure 100, metallic layer 130 is connected to a reference ground (not shown). Then, an electron beam microscope or similar apparatus can be used to generate an electron beam 210 that will expose the entire surface of wafer structure 100 to an electrical charge. A preferred embodiment of the present invention will use an electron beam microscope to generate electron beam 210, however, any device which is capable of generating an energy field which can create or induce a charge on the embedded particles may be used. In this embodiment, the surface of wafer structure 100 will be exposed to electron beam 210 with an energy level of approximately 25 keV generating a current of approximately 100 nA for a period of approximately 6 minutes. Electron beam 210 generated by the electron microscope will penetrate insulative layer 140. As previously explained, since the circuitry of wafer structure 100 is connected to a reference ground, no electrical charge will accumulate in the integrated circuits of wafer structure 100 and the grounded portions of wafer structure 100 will remain at equipotential with the reference ground. However, particle 150 will store electrical charge and eventually accumulate an electrical potential that is greater than the surrounding circuitry. It is anticipated that particle 150 will accumulate a stored charge of approximately 100 mV after being exposed to electron beam 210 for a period of six minute as described above, The temperature of wafer structure 100 is also raised to approximately 100° C. The elevated temperature will enhance the leakage of current and further prevent the circuitry of wafer structure 100 from accumulating any electrical charge from electron beam 210.

After exposure, wafer structure 100 is removed from electron beam 210 and is subjected to a period of burn-in testing. Although the voltages used in the burn-in process are the same as before, i.e. 5–6 volts, the accumulated charge on particle 150 creates an enhanced electrical field associated with particle 150. Without the additional 100 mV of stored charge on particle 150, particle 150 might not have suffered breakdown during the burn-in testing period. However, by using the present invention, the enhanced electrical field associated with the stored charge will cause particle 150 to suffer accelerated breakdown. The defect created by the breakdown associated with particle 150 will cause current leakage and circuit failure. As before, by using on-chip fuses, the circuit can now be re-routed to avoid the portion of the circuit that has the particle-related defect.

Finally, wafer structure 100 is annealed at a temperature of approximately 400° C. in a nitrogen gas environment. Processing wafer structure 100 at this temperature will allow any electrons trapped in wafer structure 100 to be transported from the trapping locations to metal layer 130 where the charge is transported to ground. This will remove any residual charge accumulated in particles other than particle 150 that did not reach the point of accelerated breakdown. It is undesirable to leave any accumulated charge stored on any embedded particle because this could lead to breakdown during normal product operation. Annealing will, therefore, reduce the possibility of failure due to breakdown during the product life of the integrated circuit. Although one specific annealing process has been described, any process for safely removing excess charge from a semiconductor wafer may be used in conjunction with the present invention. If a polimide overcoat is used, the annealing step should be completed before the coating is applied so as not to destroy the integrity of the coating. Alternatively, the polimide coating may be applied before the annealing step. However, if a polimide coating is applied first, the annealing temperature must be reduced and the annealing time extended to accomplish the goal of eliminating excess charge.

The integrated circuits of wafer structure 100 can now be processed and integrated into final products. Some integrated circuit may withstand the initial wafer level burn-in testing only to fail burn-in testing at the module level. By finding and compensating for particle contamination-related defects before the integrated circuit is incorporated into a finished product, overall product yield can be enhanced. In this manner, when combined with the use of redundant circuits, the method of the present invention can enhance the yield and significantly increase the reliability of the integrated circuits being manufactured.

Figure 3:
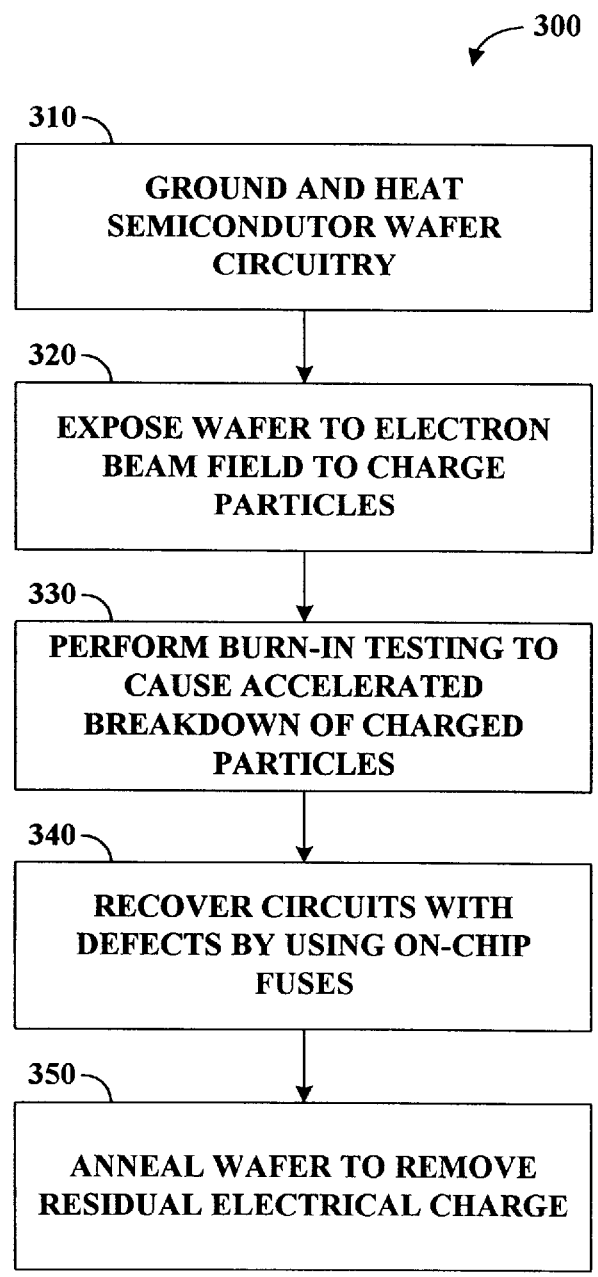
FIG. 3 is a flow diagram describing a method according to a preferred embodiment of the present invention.

Referring now to FIG. 3, a method 300 in accordance with a preferred embodiment of the present invention is described. First, after the integrated circuits have been fabricated on a wafer, the circuitry is grounded and heated (Step 310). Then, the wafer is exposed to an electron beam which is created by an electron beam microscope or other apparatus which can generate an appropriate electron beam (Step 320). In this step, the electron beam penetrates the surface of the wafer and creates an enhanced electrical charge on any conducting or semi-conducting particles that are embedded in the wafer. After the charge has been allowed to accumulate, burn-in testing is performed on the wafer using standard burn-in techniques (Step 330). This burn-in testing can be accomplished at elevated temperatures and voltage levels to accelerate the breakdown of the oxide. The burn-in testing will cause accelerated breakdown and circuit failure due to the accumulated charge which has been stored on the particles during exposure to the electron beam in step 320. After burn-in testing has been completed, defective circuits can be recovered by using standard yield recovery techniques such as on-chip fuses and redundant circuit paths (Step 340). Finally, the wafer is annealed to remove any residual charge that may remain on any particles which did not reach a high enough energy potential to suffer breakdown (Step 350).

While the present invention has been particularly shown and described with reference to preferred embodiments thereof, it will be understood by those skilled in the art that various changes in form and details may be made therein without departing from the spirit and scope of the invention. For example, the period of exposure to electron beam 210 may be extended to accumulate additional charge on particle 150. It is anticipated that a 12 minute exposure to electron beam 210 as described above will yield an increased potential of approximately 200 mV for particle 150. The intensity and energy level of electron beam 210 may also be increased or decreased as desired to accomplish the same goal. Any process whereby an electrical potential is accumulated in particle 150 prior to burn-in testing to accomplish the purpose described herein is within the scope of the present invention. In addition, any yield recovery techniques known to those skilled in the art may used in conjunction with the present invention to recover defective circuits after breakdown has occurred.

We claim:

1. A method of improving integrated circuit reliability, the method comprising the steps of:
   providing a layered wafer, the wafer comprising:
      a substrate having a plurality of diffused regions;
      at least one overlying conductive layer;
      at least one overlying non-conductive layer, wherein the at least one non-conductive layer contains at least one embedded electrically-isolated conductive particle,
      and wherein the substrate, the plurality of diffused regions, and the at least one conductive layer are all electrically grounded; and
   exposing the wafer to an electron beam of a pre-determined energy level for a pre-determined period of time, thereby increasing the electrical potential of the at least one embedded electrically-isolated conductive particle.

2. The method of claim 1 further comprising the step of performing burn-in testing on the wafer.

3. The method of claim 1 further comprising the step of annealing the wafer.

4. The method of claim 1 wherein the pre-determined energy level is 25 keV.

5. The method of claim 1 wherein the pre-determined period of time is six minutes.

6. The method of claim 1 wherein the pre-determined period of time is twelve minutes.

7. The method of claim 1 wherein the pre-determined energy level is 25 keV and the given period of time is six minutes.

8. The method of claim 1 further comprising the step of using a redundant circuit to bypass an inoperative circuit path.

9. The method of claim 1 wherein the substrate contains N-well or P-well sources, drains, and junctions.

10. The method of claim 1 further comprising elevating the temperature of the wafer to enhance current dissipation.

11. A method of improving integrated circuit reliability, the method comprising the steps of:

providing a layered wafer, the wafer comprising:
- a substrate having a plurality of diffused regions;
- at least one overlying conductive layer;
- at least one overlying non-conductive layer, wherein the at least one non-conductive layer contains at least one embedded electrically-isolated conductive particle,
- and wherein the substrate, the purality of diffused regions, and the at least one condutive layer are all electrically grounded;

exposing the wafer to an electron beam with an energy level of 25 keV for a period of six minutes, thereby increasing the electrical potential of the at least one embedded electrically-isolated conductive particle;

performing burn-in testing on the wafer; and annealing the wafer to remove any excess electrical potential from the wafer.

12. The method of claim 11 further comprising the step of using a redundant circuit to bypass an inoperative circuit path.

13. The method of claim 11 wherein the substrate contains N-well or P-well sources, drains, and junctions.

14. The method of claim 11 further comprising elevating the temperature of the wafer to enhance current dissipation.

15. A method of improving integrated circuit reliability, the method comprising the steps of:

providing a layered wafer, the wafer comprising:
- a substrate having a plurality of diffused regions;
- at least one overlying conductive layer;
- at least one overlying non-conductive layer, wherein the at least one non-conductive layer contains at least one embedded electrically-isolated conductive particle,
- and wherein the substrate, the purality of diffused regions, and the at least one condutive layer are all electrically grounded;

exposing the wafer to an electron beam with an energy level of 25 keV for a period of six minutes, thereby increasing the electrical potential of the at least one embedded electrically-isolated particle;

elevating the temperature of the wafer to enhance current dissipation;

performing burn-in testing on the wafer;

using a redundant circuit to bypass an inoperative circuit path; and annealing the wafer to remove any excess electrical potential from the wafer.

* * * * *